United States Patent [19]

Fegley et al.

[11] 4,094,410

[45] June 13, 1978

[54] METHODS OF AND APPARATUS FOR CONVEYING, TESTING AND SORTING ARTICLES AND STRAIGHTENING THEIR LEADS

[75] Inventors: Charles R. Fegley, Laureldale; Richard H. Morrow, Temple; Arthur G. Naylor, Wyomissing, all of Pa.

[73] Assignee: Western Electric Co., Inc., New York, N.Y.

[21] Appl. No.: 731,279

[22] Filed: Oct. 12, 1976

[51] Int. Cl.² .............................................. B07C 5/08
[52] U.S. Cl. .................................. 209/73; 209/81 R; 140/147 T; 198/345
[58] Field of Search ............... 209/81, 74 R, 74 M, 209/73; 198/345, 491, 492, 532, 563, 567; 221/266; 140/147, 140

[56] References Cited

U.S. PATENT DOCUMENTS

| 2,986,274 | 5/1961 | Minchenko | 209/81 |
|---|---|---|---|
| 3,045,739 | 7/1962 | Fyfe et al. | 72/70 |
| 3,083,743 | 4/1963 | Fick | 140/147 |
| 3,185,186 | 5/1965 | Kinser et al. | 140/147 |
| 3,220,443 | 11/1965 | Smith et al. | 140/147 |
| 3,225,797 | 12/1965 | Stoody | 140/147 |
| 3,520,335 | 7/1970 | Patterson | 140/147 |
| 3,520,336 | 7/1970 | Zemek | 140/147 |
| 3,542,087 | 11/1970 | Fegley | 140/147 |
| 3,548,998 | 12/1970 | Heller | 209/75 |
| 3,570,559 | 3/1971 | Palmer | 140/147 |
| 3,637,065 | 1/1972 | Ruscitti | 198/33 |
| 3,802,599 | 4/1974 | Beltz et al. | 221/1 |

OTHER PUBLICATIONS

Western Electric Technicial Digest, No. 35, Jul., 1974, R. M. Filek et al., pp. 19–20.
Western Electric Technical Digest, No. 39, Jul., 1975, B. C. Abraham et al., pp. 1–2.

*Primary Examiner*—Allen N. Knowles
*Attorney, Agent, or Firm*—R. Y. Peters

[57] ABSTRACT

In making electronic components, it is usually necessary to test and sort the components in accordance with their characteristics. In carrying out such operations, the components are guided along a first portion of a path tangential to a rotatable member having notches spaced in the periphery thereof. The rotatable member is moved to engage one notch with each component to support such component and to space it from the other components in accordance with the spacing of the notches. The rotatable member controllably moves the articles along a second portion of a path adjacent the first portion. The rotatable member is then stopped and the leads of each supported component are straightened. The components are then fed to another rotatable member and controllably moved to a testing facility. While the other rotatable member is stopped, the leads of each component are engaged by contacts of the testing facility to determine certain characteristics of each component. Finally, each component is sorted in accordance with its characteristics.

19 Claims, 8 Drawing Figures

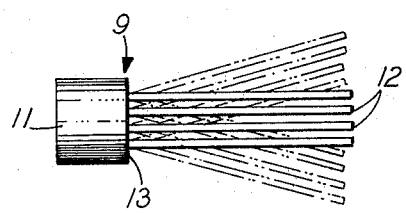
FIG.-1
FIG.-2
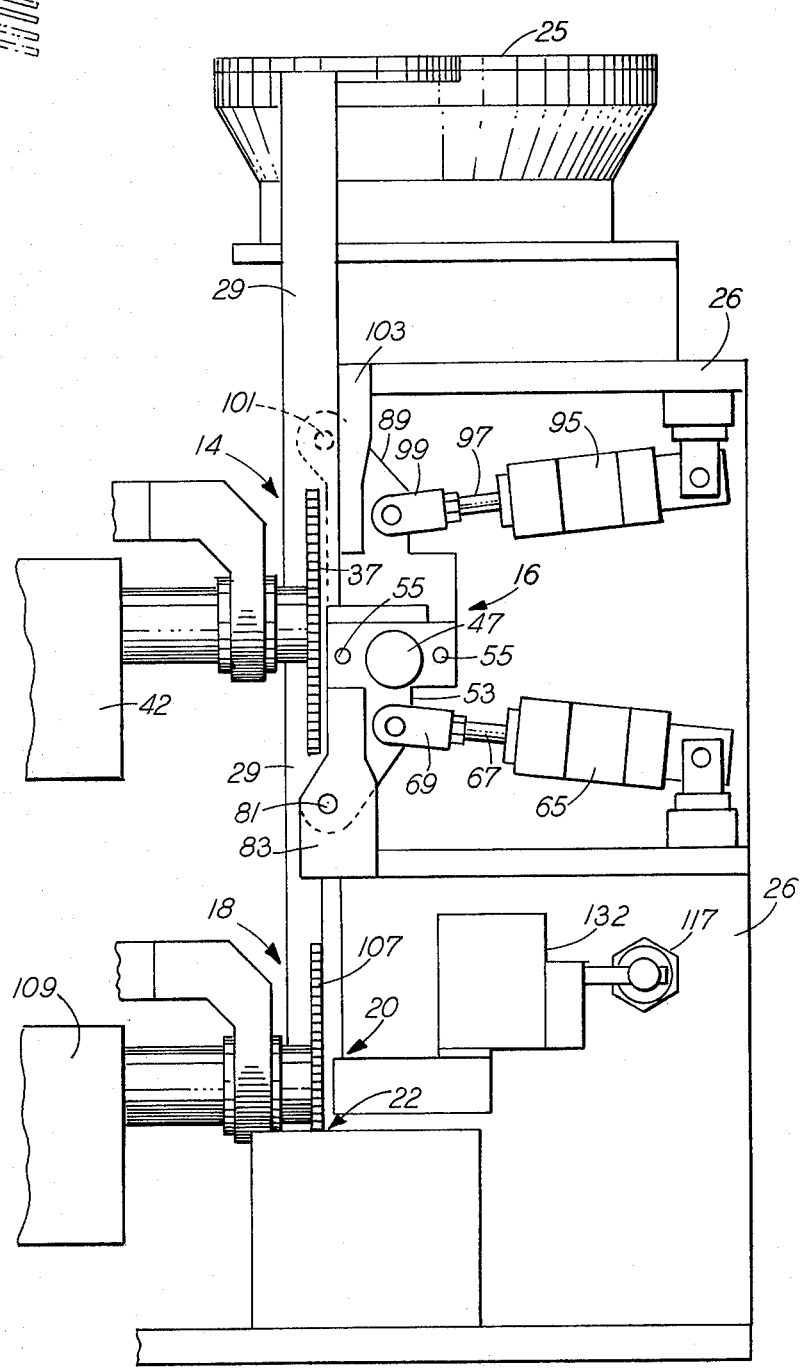

METHODS OF AND APPARATUS FOR CONVEYING, TESTING AND SORTING ARTICLES AND STRAIGHTENING THEIR LEADS

BACKGROUND OF THE INVENTION

1. Field of the Invention

This invention relates to methods of and apparatus for conveying, testing and sorting articles and straightening their leads. More particularly, this invention relates to methods of and apparatus for controllably conveying leaded electronic components, holding the components stationary while straightening their leads and then controllably conveying the components to a testing facility, again holding the components stationary while testing them, and then sorting them in accordance with the test results.

This invention is suited for use in the manufacture of electronic components, such as transistors and diodes. It is particularly suited for testing and sorting components having leads extending therefrom, where it is necessary or desirable to straighten the leads prior to the testing.

2. Description of the Prior Art

In the manufacture of electronic components such as diodes and transistors, it is often necessary to electrically test the components and sort them in accordance with the test results. In the event the components have leads, such leads often touch each other and become bent during their handling, and this has made testing and sorting difficult with prior art facilities. This difficulty might result from the leads touching each other and shorting out portions of the component, or from the leads being bent so as not to make contact with the testing facilities.

Accordingly, it is desirable to separate and straighten the leads prior to testing the components, and to carry out the straightening in two mutually perpendicular directions. It is also desirable to securely support the components while straightening their leads and making electrical contact to them for testing. It is equally important to accomplish the conveying, lead straightening, testing and sorting at high speeds with a mechanism that has an increased output and that requires minimum maintenance and minimum operator handling. Such high speeds are more readily obtainable if, for example, the components have a precise and repeatable position relative to the mechanisms that perform operations on the components, such as lead separating, straightening, testing and sorting.

It is also desirable to carry out these operations with a relatively simple mechanism that does not put excessive bending or tensioning forces on the components and thereby reduces the likelihood of damage to the components.

SUMMARY OF THE INVENTION

It is, therefore, an object of this invention to provide new and improved methods of and apparatus for conveying, testing and sorting articles and straightening their leads. Another object of this invention is the provision of methods of and apparatus for controllably conveying leaded electronic components, holding the components stationary while straightening their leads and then controllably conveying the components to a testing facility, again holding the components stationary while testing them and then sorting them in accordance with the test results.

With these and other objects in view, the present invention contemplates a new method of conveying articles, wherein the articles are guided along a first portion of a path tangential to a rotatable member. This member has notches spaced on the periphery thereof which substantially conform to the outer configuration of the articles. The rotatable member is moved to engage each article with one notch to space the articles from each other in accordance with the spacing of the notches, to support the articles in the notches and to controllably move the articles with the rotatable member along a second portion of the path adjacent the first portion.

The present invention also contemplates a new apparatus for conveying articles which includes the previously described rotatable member. Facilities are provided for guiding the articles along a first portion of a path tangential to the rotatable member to engage each article with one notch to space the articles as previously described. Additional facilities are provided for moving the rotatable member to controllably move the articles with such member along a second portion of the path adjacent the first portion.

BRIEF DESCRIPTION OF THE DRAWINGS

Other objects and advantages of the present invention may be more clearly understood by reference to the following detailed description and drawing wherein:

FIG. 1 is a front elevational view of an electronic component to be conveyed, tested and sorted in accordance with the present invention, and which has leads which are to be straightened in accordance with the present invention;

FIG. 2 is a front elevational view of the overall apparatus of the present invention showing a chute for conveying the components of FIG. 1 to a pair of parallel wheels for supporting the components for various operations in accordance with the present invention;

DETAILED DESCRIPTION

OVERALL APPARATUS

Figure 3:
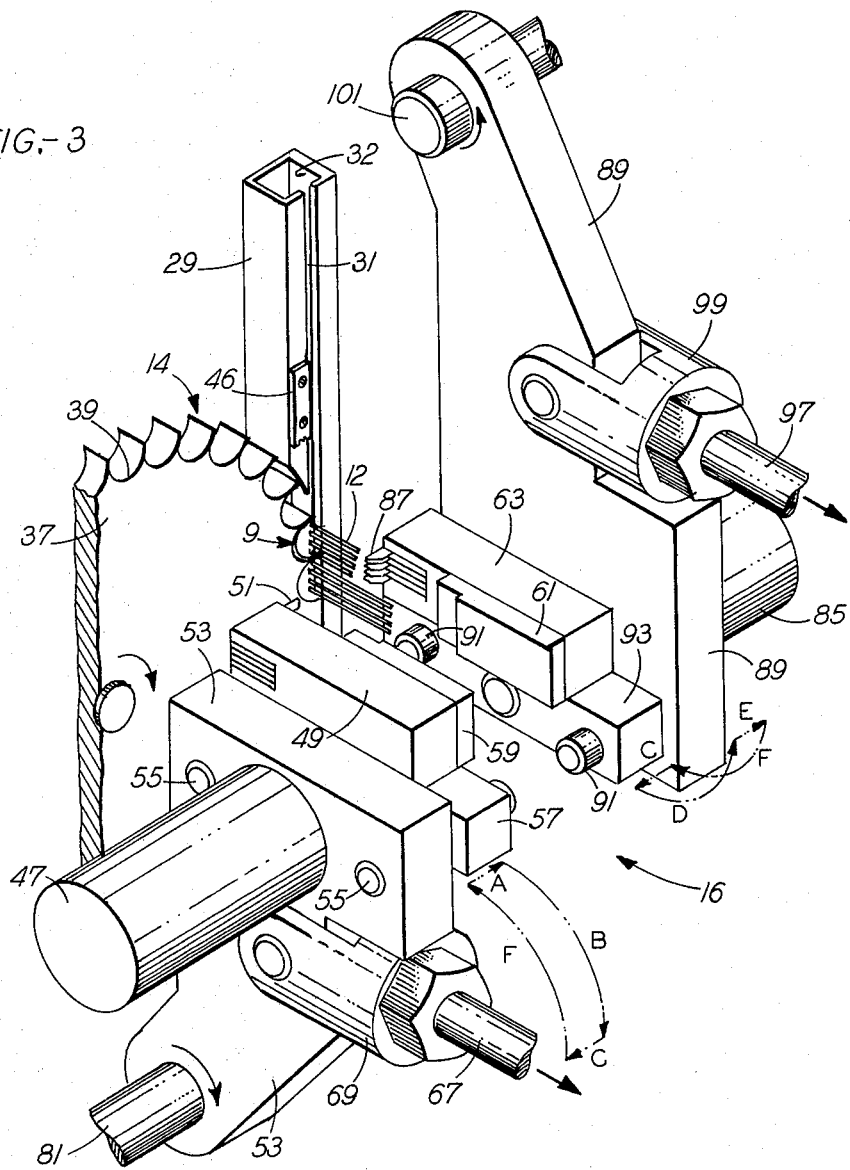
FIG. 3 is a perspective view, partially cut away, of a portion of the apparatus of FIG. 2 showing the conveying wheel of FIG. 2 and the manner in which it cooperates with the lead straightening mechanism of FIG. 2.
Figure 4:
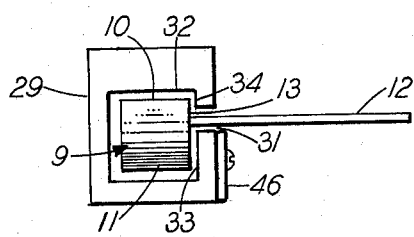
FIG. 4 is a cross-sectional view of the chute of FIG. 3, showing the manner in which the component of FIG. 1 is located in such chute.

Referring to FIG. 2, there is shown an overall apparatus of the present invention for conveying, testing and sorting a plurality of articles. The articles may be any type of those requiring these kinds of operations, such as diodes, transistors or other electronic components. For example, the articles may be leaded components, such as those designated generally by the numeral 9 and shown in FIGS. 1, 3-8 as having flat sides 10 (FIGS. 4 and 7) and semi-cylindrical convex sides 11. Also, the leads 12 may extend from only one end 13 of the component 9, as shown in FIGS. 1, 3 and 4.

Since the components 9 have leads 12 to which it is necessary to make electrical contact for testing, it is advantageous to straighten these leads 12 which are at least slightly resilient. Accordingly, the apparatus of FIG. 3 is also capable of performing this operation.

The apparatus of FIG. 2 has five major constituent parts: (1) a component conveying mechanism, designated generally by the numeral 14; (2) a lead straightening mechanism, designated generally 16; (3) another component conveying mechanism, designated 18; (4) a component testing mechanism, designated generally 20; and (5) a component sorting mechanism, designated generally 22.

COMPONENT CONVEYING MECHANISM

A quantity of the articles or the components 9 to be conveyed, tested and sorted are dumped into a conventional vibratory feed bowl 25 (FIG. 2) appropriately mounted to a supporting frame 26. The bowl 25 feeds the components 9 down a chute 29 (FIGS. 2, 3 and 4) under the force of gravity, which may be assisted by other forces such as vibrational or pneumatic ones.

The chute 29 has an opening 31 (FIGS. 3 and 4) through which the leads 12 extend. The chute 29 also includes retaining walls 33 and 34 adjacent the opening 31 for holding the components 9 laterally in the chute 29, despite any tensional forces that may be applied to the leads 12.

Additionally, the chute 29 has a back wall 32 that is engaged by the flat sides 10 of the components 9 as they are fed down the chute 29. From FIGS. 3, 4 and 5, it is apparent that the back wall 32 comforms with the flat sides of the components 9.

From the chute 29, the components 9 are fed tangentially to the component conveying mechanism 14 (FIG. 3). The mechanism 14 includes a component handling wheel 37 having a plurality of notches 39 spaced on the periphery thereof. The notches 39 substantially conform to at least a portion of the outer configuration of the components 9 to be handled. In the present embodiment of the invention, the components 9 have semi-cylindrical convex sides 11, and the notches 39 substantially conform to these sides 11.

It is important to note that the notches 39 are spaced from each other a distance such that there is a reduction in the likelihood of one of the components 9 being jammed between the periphery of the wheel 37 where there are no notches 39 and the back wall 32 of the chute 29 and thereby jamming the wheel 37 and damaging such components 9 by, for example, crushing them. In the present embodiment, since each component 9 has a semi-cylindrical side 11, the radii of the notches 39 are substantially tangent to each other.

LEAD STRAIGHTENING MECHANISM

Figure 5:
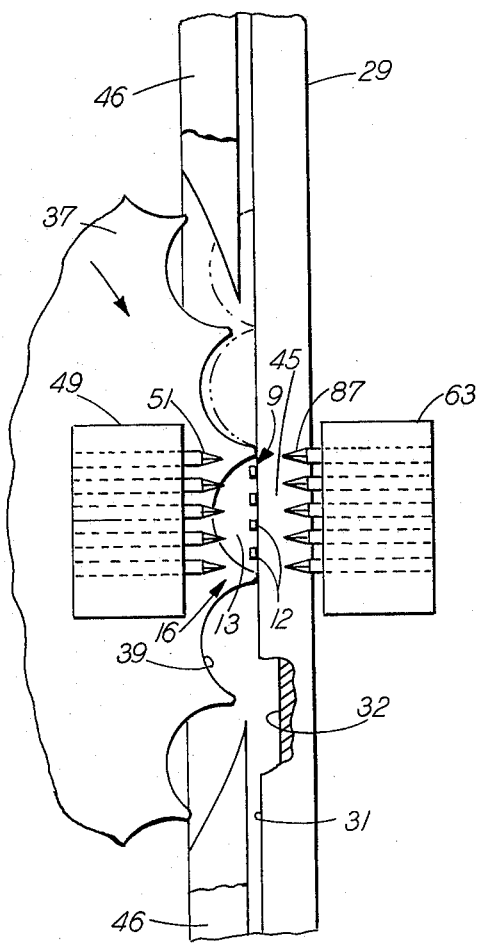
FIG. 5 is a front elevational view of a portion of the apparatus of FIG. 3, showing the manner in which lead straightening combs are positioned for straightening the leads of a component of FIG. 1.

A motor 42 (FIG. 2), appropriately supported and coupled to the shaft of the wheel 37, rotatably steps such wheel 37 to feed each component 9 one at a time to the lead straightening mechanism 16 (FIGS. 2, 3 and 5). After each component 9 arrives at a position, designated generally 45 (FIG. 5), it is supported in a direction axial relative to the wheel 37 by a retaining plate 46 shown in FIGS. 3 and 4. At this position such component 9 is also supported by the notch 39 and the back wall 32 which is tangential to the wheel 37.

At the position 45 (FIG. 5), the component 9 remains stationary for a predetermined time. During that time an air cylinder 47 (FIGS. 2 and 3) is actuated to move a comb 49 rightwardly, in the direction shown by an arrow A beneath the comb 49 in FIG. 3.

The movement of the comb 49 moves its pointed teeth 51 between the leads 12 of the stationary component 9 at position 45 to engage the sides of the leads 12 with the sides of the teeth 51. This movement, which is linear as shown by arrow A, straightens the leads 12 in the direction of arrow A. It should be noted that there is no overbend of the leads 12 effected by this movement because the straightening of the leads 12 along their short sides of their rectangular cross-sections, as shown in FIG. 5, is not sufficiently critical for the subsequently performed operations on such leads 12.

The air cylinder 47 is fixed to a pivotal arm 53 (FIG. 3) having guide pins 55 extending therefrom. The movement of the comb 49, which is fixed to a slide block 57, is under the guidance of these pins 55 on which the block 57 slides. This movement continues until terminated by a stop 59 on the comb 49 striking a stop 61 on another comb 63.

After the termination of the movement of the comb 49 in the direction of the arrow A, an air cylinder 65 (FIG. 2) is actuated to impart arcuate movement to the comb 49 and its teeth 51, such arcuate movement being in the direction shown by an arrow B beneath the comb 49 in FIG. 3. This movement slides the teeth 51 against the leads 12, which are slightly resilient, to place a slight bend in such leads 12 and to separate them from each other.

It should be noted that the movement of the teeth 51 places a slight overbend in the leads 12, somewhere between about 5° and about 10° beyond their ultimately desired straightend position where the leads 12 are perpendicular to the ends 13 of the components 9, as shown in FIG. 1. This overbend is subsequently removed by the resiliency of the leads 12, which causes them to spring back substantially to their desired position.

It should also be noted that the arcuate movement of the teeth 51 provides a convenient way to achieve this limited overbend of the leads 12 without placing excessive tensional or bending forces on such leads 12 to reduce their likelihood of damage by this straightening operation. This movement also reduces the likelihood of excessive bending of the leads 12 at critical points, such as the sides 13 of the components 9 where such bending might very easily damage the components 9.

The air cylinder 65 is appropriately secured to the frame 26, as shown in FIG. 2, and has its piston rod 67 (FIGS. 2 and 3) fixed to a yoke 69 that is pivotally mounted to the arm 53. The arcuate movement of the comb 49 in the direction of arrow B is imparted by the withdrawal of the rod 67 by the cylinder 65 to pivot the arm 53 about a pivot rod 81 mounted to another yoke 83 (FIG. 2) appropriately mounted to the frame 26.

Next, the air cylinder 47 is actuated to move leftwardly the comb 49 and its teeth 51 in the direction of an arrow C beneath the comb 49 in FIG. 3. Such movement results in the disengagement of the teeth 51 of the comb 49 from the leads 12 of the component 9.

Simultaneous with acutation of the air cylinder 47 and the leftward movement of the comb 49, another air cylinder 85, similar to air cylinder 47 and mounted similarly to such cylinder 47, is actuated. The actuation of cylinder 85 moves the comb 63 and its teeth 87 leftwardly in the direction of an arrow C adjacent the comb 63 in FIG. 3.

The air cylinder 85 is fixed to a pivotal arm 89 having guide pins 91 extending therefrom. The movement of the comb 63, which is fixed to a slidelock 93, is under the guidance of these pins 91 on which the block 93 slides. The movement of the comb 63 continues until terminated by the stop 61 of the comb 63 striking the stop 59 on the other comb 49.

The movement of the comb 63 in the direction of arrow C straightens the leads 12 in this direction which is opposite to the direction of arrow A. Thus, the leads 12 are straightened at this time in two directions.

After the termination of the movement of the comb 63 in the direction of the arrow C beneath it, an air cylinder 95 (FIG. 2) is actuated to impart arcuate movement to the comb 63 and its teeth 87, such arcuate movement being in the direction shown by an arrow D adjacent the comb 63 in FIG. 3.

The movement of the comb 63 slides the teeth 89 in a direction opposite to that of the teeth 51 of the comb 49 and against the leads 12 to slightly overbend the leads 12 by about 5° to about 10° in the direction of arrow D which is opposite to arrow B. This results in substantially straightening and equispacing the leads 12 from each other perpendicular to the ends 13 of the components 9 in preparation for testing and sorting the components 9.

If the leads 12 of the component 9, which are slightly resilient, are initially bent to a considerable extent out of their normal configuration, then the bending of the leads 12 by the combs 49 and 63 is beyond their elastic limit, resulting in the plastic deformation of the leads 12 to acquire their normal configuration, as shown in FIG. 3.

As in the case of the air cylinder 65, the air cylinder 95 is also appropriately mounted to the frame 26, as shown in FIG. 2 and its piston 97 (FIGS. 2 and 3) is fixed to a yoke 99 which is pivotally mounted to the arm 89. The arcuate movement of the comb 63 in the direction of the arrow D is imparted by the withdrawal of the rod 97 by the cylinder 95 to pivot the arm 89 about a pivot rod 101 mounted to another yoke 103 (FIG. 2) appropriately mounted to the frame 26.

Next, the air cylinder 85 moves the comb 63 in the direction shown by the arrow E in FIG. 3. Then, air cylinders 65 and 95 simultaneously move the combs 49 and 63, respectively, in the directions shown by the arrows F in FIG. 3 beneath and adjacent the combs 49 and 63. This movement returns the combs 49 and 63 to their initial positions and prepares them for the next lead straightening operation on another component 9.

OTHER COMPONENT CONVEYING MECHANISM

After the leads 12 of the component 9 have been straightened, such component 9 is released from the notch 39 of the wheel 37 by the continued stepped rotation of the motor 42 coupled to the shaft of the wheel 37. The component 9 then advances under the influence of gravity down a lower section of the chute 29 to the other component conveying mechanism 18 which is similar to the component conveying mechanism 14. Advancement of the component 9 may be assisted by a jet of air or vibrational forces. In advancing to the other conveying mechanism 18, the component 9 is fed tangentially to a handling wheel 107 (FIGS. 2 and 6); whereupon, such component 9 is engaged by a notch 108 (FIG. 6) in such wheel 107.

TESTING MECHANISM

The wheel 107 is rotatably stepped by a motor 109 (FIG. 2), appropriately supported and coupled to the shaft of such wheel 107, to move the component 9 to the testing mechanism 20. At this mechanism 20 the component 9 is brought to rest for testing at a position 111 (FIG. 6) between a pair of movable contact jaws 113 and 115, which are open at this time. While at position 111, the component 9 is supported by the notch 108, the back wall 32 of the chute 29 which is tangential to the wheel 107, and a retaining plate 112, shown partly broken away in FIG. 6.

While the component 9 is held at rest at position 111, an air cylinder 117 is actuated to withdraw its piston rod 119 to pivot an arm 121 against a tension spring 125 and in a clockwise direction about a shaft 123. The pivoting of the arm 121 rotates a pinion 127 in a clockwise direction about the shaft 123 to rotate another pinion 129, that engages the pinion 127, in the opposite direction about its shaft 131.

The shafts 123 and 131, which are appropriately supported in a yoke 132, are fixed to the movable jaws 113 and 115 and pivot these jaws 113 and 115 toward each other. This engages contacts 133 of the jaw 113 and contacts 135 on the jaw 115 with the leads 12 of the component 9. The contacts 133 and 135 are insulated from each other and from the jaws 113 to 115. The engagement of the contacts 133 and 135 with the leads 12 electrically connects the component 9 to a conventional test set 137, such as that sold by Teradyne under the trade designation "Model T347."

SORTING MECHANISM

The test set 137 performs parametric and functional tests on the components 9 and stores the test results. Next, the contact jaws 113 and 115 are opened by the actuation of the air cylinder 117 and the extension of its piston rod 119. Then, upon the continued stepped rotation of the wheel 107 by the motor 109, the component 9 is moved from the position 111 and slidably along a stationary rim 139 that has a curvature corresponding to that of the wheel 107. As the component 9 moves slidably along the rim 139, it sequentially passes a plurality of bins 141 of the sorting mechanism 20.

The test set 137, which has stored the test results of the component 9, then selectively actuates one of a plurality of solenoids 143 to move its plunger 145 against the component 9 in an axial direction relative to the wheel 107 to discharge the component 9 into one of the bins 141 in accordance with the test results. Thus, the component 9, which has had its lead 12 straightened into two mutually perpendicular directions, has been sorted in accordance with certain of its characteristics. The other components 9 have their leads 12 straightened and are tested and sorted in the same manner, the various parts of the apparatus of the prevent invention being appropriately synchronized to accomplish this.

ALTERNATIVE EMBODIMENT

Figure 7:
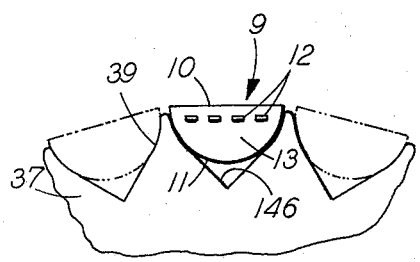
FIG. 7 is a front elevational view of a portion of the conveying wheel of FIG. 3 showing an alternative embodiment for securely holding a component in a V-shaped groove of such wheel.

FIG. 7 shows an alternative embodiment of the component handling wheel 37. In this embodiment the notches 39 have V-shaped grooves 146 formed in the bases of the notches 39 such that intersecting planes of the grooves 40 are parallel to the axis of the wheel 37. The grooves 146, thus, provide two positive lines of engagement for the convex sides 11 of the components 9 and, therefore, assure that the components 9 have a predetermined and a repeatable position with respect to the lead straightening mechanism 16 to which they will be subsequentially fed. Also, the other wheel 107 may include similar grooves 146.

Figure 8:
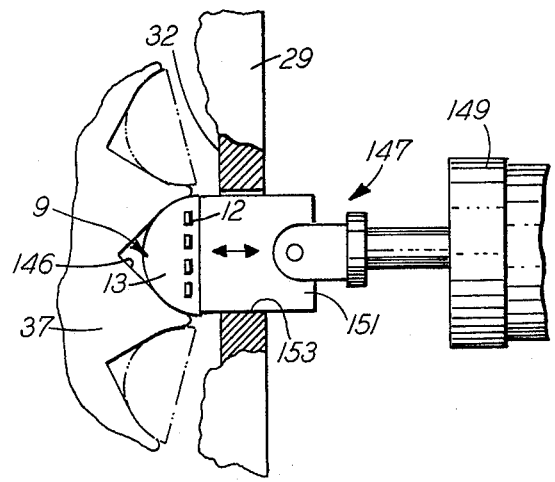
FIG. 8 is a front elevational view, partially cut away, showing as an alternative embodiment a plunger mechanism for accurately positioning a component in the V-shaped groove of FIG. 7.
Figure 6:
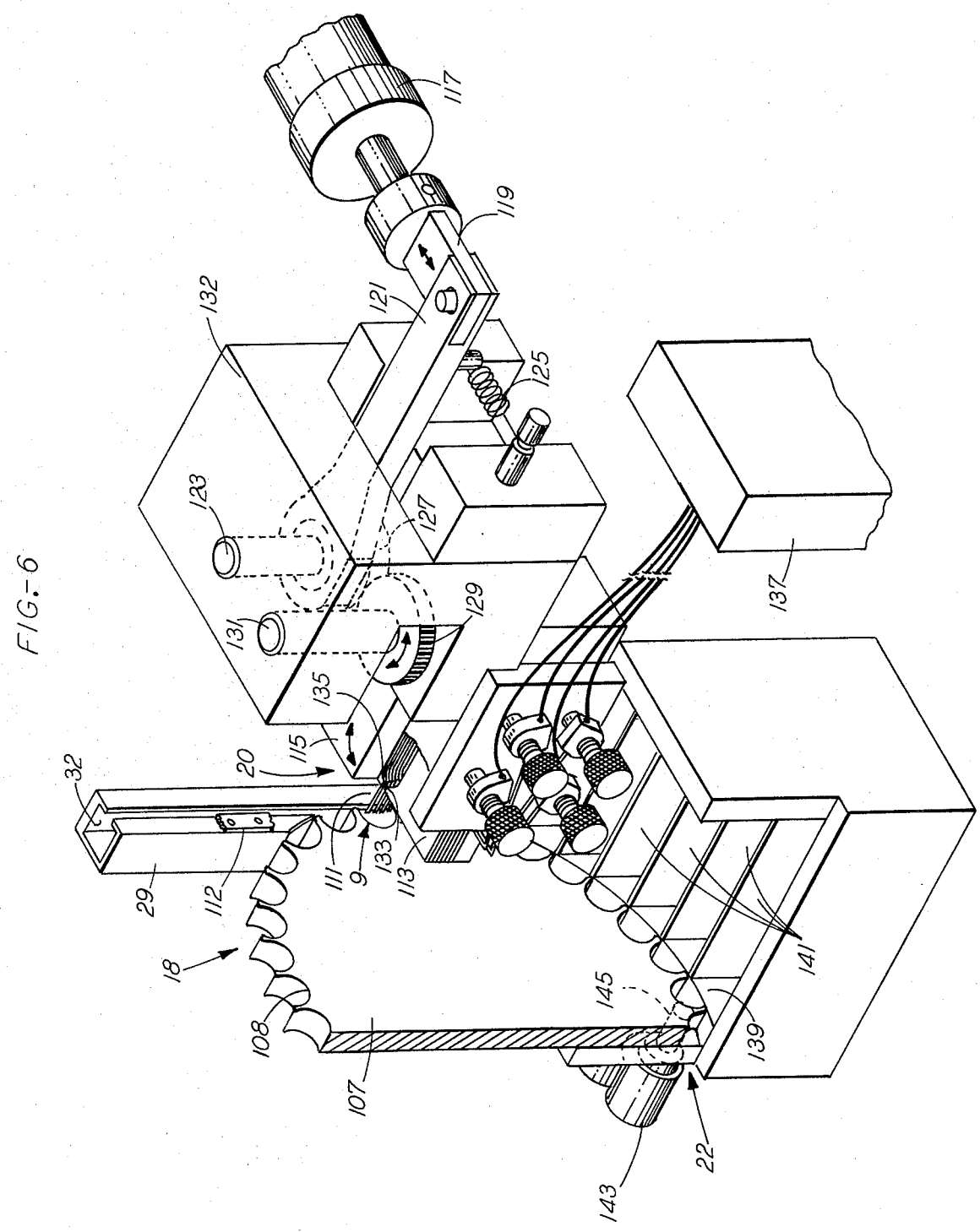
FIG. 6 is a perspective view, partially cut away and partially in schematic, showing the mechanism of FIG. 2 for testing the components and sorting them in accordance with such testing.

Moreover, as an alternative embodiment, the component 9 may be accurately positioned for lead straightening and testing, in the V-shaped grooves 146 of the notches 39 by a plunger mechanism 147, shown in FIG. 8. The mechanism 147 includes an air cylinder 149, the actuation of which extends a plunger 151 through a slot 153 in the back wall of the chute 29 to engage the components 9 one at a time and positively seat them in the V-shaped grooves 146 of the notches 39.

It is to be understood, of course, that the plunger 151 engages the components 9 only when the wheels 37 are in their stationary positions. Of course, a similar mechanism may be used with wheel 107.

It is to be understood that the above-described arrangements are simply illustrative of the application of the principles of the invention. Numerous other arrangements may be readily devised by those skilled in the art which embody the principles of the invention and fall within its spirit and scope.

What is claimed is:

1. A method of conveying articles which comprises the steps of:
    guiding the articles along a first portion of a path tangential to a rotatable member having notches spaced on the periphery thereof which substantially conform to at least a part of the outer configuration of the articles; and
    moving the rotatable member to engage such part of each of the articles with one notch to space the articles from each other in accordance with the spacing of the notches, to support the articles in the notches and to controllably move the articles with the rotatable member along a second portion of the path adjacent to, and in alignment with, the first portion.

2. The method of claim 1, wherein the first portion of the path is a flat wall and conforms to at least to another part of the outer configuration of the articles, the rotatable member and the flat wall cooperating to space, support and controllably move the articles, and the rotatable member and the notches are spaced from each other a distance related to the size of the articles such that there is a decrease in the likelihood of the articles being jammed between the rotatable member and the flat wall and a decrease in the likelihood of the rotatable member jamming and damaging the articles.

3. The method of claim 1, wherein each article has leads extending therefrom, and wherein the method comprises the additional steps of:
    stopping the rotatable member;
    straightening the leads of each supported article while the rotatable member is stopped;
    engaging the leads of each supported article with a testing facility, while the rotatable member is stopped, to determine a characteristic of each article; and
    sorting each article in accordance with the characteristic.

4. The method of claim 1, wherein the articles have a semi-cylindrical convex configuration, the notches have a semi-cylindrical concave configuration, and the notches are contiguous to each other so as to prevent the periphery of the rotatable member from crushing the articles between such periphery and the path.

5. The method of claim 4, wherein each notch has a V-shaped groove formed in the base thereof, such that the intersecting planes of the grooves are parallel to the axis of the rotatable member to provide two positive lines of engagement for the convex configuration of the articles.

6. A method of performing an operation on articles, which comprises the steps of:
    moving a wheel having notches spaced on the periphery thereof, the notches substantially conforming to the outer configuration of the articles;
    moving the articles along a first portion of a flat wall tangential to the wheel to engage such article with one notch to support the articles in the notches and against the wall, to space the articles from each other in accordance with the spacing of the notches and to move the articles along a second portion of the flat wall adjacent the first portion, such movement being under the control of the wheel and being tangential to the wheel;
    stopping sequentially the movement of the wheel while each article is located at such second position to perform the operation sequentially on the articles; and
    moving the wheel after the performance of the operation to move the articles away from the wheel and along a third portion of the flat wall adjacent the second portion of such wall.

7. The method of claim 6, wherein the article is a leaded electronic component and the operation is the straightening of the leads.

8. A method of straightening the leads of a component, which leads are at least slightly resilient, which comprises the steps of:
    supporting the component;
    engaging the leads of the component with a combing device;
    moving the combing device in a first arcuate direction to bend the leads; and then
    moving the device in a second arcuate direction opposite the first arcuate direction to remove the bend from leads, the bending resulting in straightening of the leads.

9. A method of straightening the leads of a component having a body portion, the leads being at least partially resilient, which comprises the steps of:
    holding the body portion of the component;
    moving a comb in a first direction toward the leads to engage the leads and place a first bend in them;
    moving the comb arcuately in a second direction at a right angle to the first direction to place a second bend in the leads;
    moving the comb in a third direction at a right angle to the second direction and away from the leads to disengage the comb from the leads;
    moving another comb in a fourth direction opposite the first direction and towards the leads to engage the leads to remove the first bend from the leads;
    moving the other comb arcuately in a fifth direction opposite to the second direction to remove the second bend from the leads; and moving the other comb in a sixth direction at a right angle to the first direction to disengage such other comb from the leads, whereby the leads are straightened.

10. The method of claim 9, wherein the leads extend from one end of the component and are bent pivotally in the range of about 5° to about 10° beyond their desired straightened position.

11. A method of sorting electronic components with resilient leads extending from body portions thereof, which comprises the steps of:
rotatably stepping a first wheel having spaced notches corresponding to the body portions of the components, the notches being located on the periphery of the wheel;
conveying tangentially the components to the first wheel so that the body portion of each component engages and is supported by one of the notches, the movement of the component being under the control of the first wheel;
engaging the leads of each supported component with a combing device while the first wheel is at rest;
moving the combing device arcuately in a first direction and then arcuately in a second direction opposite the first direction to straighten said leads of the components;
rotatably stepping a second wheel having notches similar to those of the first wheel;
conveying tangentially the components with straightened leads to the second wheel so that the support and movement of each component is under the control of the second wheel;
engaging the straightened leads with electrical contacts of a testing facility to determine certain characteristics of each component; and
ejecting each component into a bin in accordance with such characteristics.

12. The method of claim 11, wherein the ejecting of each component is effected by pushing such component in an axial direction relative to the second wheel.

13. An apparatus for conveying articles, which comprises:
a rotatable member having notches spaced on the periphery thereof, the notches substantially conforming to at least a part of the outer configuration of the articles;
means for guiding the articles along a first portion of a path tangential to the rotatable member; and
means for moving the rotatable member to engage said part of each article with one notch to space the articles in accordance with the spacing of the notches, to support the articles in the and to controllably move the articles with the rotatable member along a second portion of the path adjacent to, and in alignment with, the first portion.

14. The apparatus of claim 13, wherein the means for guiding the articles along the first path includes a chute having a straight back wall adapted to slidably engage other portions of the articles, the back wall being arranged tangential to the periphery of the rotatable member and cooperating with such member in spacing, supporting and controllably moving such articles, and wherein means are provided for accurately locating the components in the notches.

15. The apparatus of claim 14, further comprising:
another rotatable member having notches spaced on the periphery thereof, the notches substantially conforming to the portions of the outer configuration of the articles, the other rotatable member being located in the same plane as the first rotatable member, the rotatable members being spaced from each other, the back wall of the chute being tangential to both rotatable members; and
additional means for guiding the articles along a first portion of a path tangential to the other rotatable member to engage each article with one notch in the other rotatable member to space the articles from each other in accordance with the spacing of such notches and to controllably move the articles with the other rotatable member along a second portion of the path adjacent the first portion.

16. The apparatus of claim 13, wherein the means for moving the rotatable member sequentially stops to hold sequentially each article stationary to permit the performance of an operation thereon.

17. An apparatus for performing an operation on articles, which comprises:
a wheel having notches spaced on the periphery thereof, the notches substantially conforming to the outer configuration of the articles;
means for moving the articles along a first portion of a flat wall tangential to the wheel;
means for moving the wheel to engage each article with one notch to support the articles in the notches against the wall, to space the articles from each other in accordance with the spacing of the notches and to move the articles along a second portion of the flat wall adjacent the first portion, such movement being under the control of the wheel and being tangential to the wheel;
means for stopping the movement of the wheel while each article is located at such second portion to enable an operation to be performed on the article; and
means for again moving the wheel after the performance of the operation to move the articles away from the wheel and along a third portion of the path adjacent the second portion of the path.

18. An apparatus for straightening the leads of a component, which comprises:
means for supporting the component;
means for engaging the leads of the components with a combing device;
means for moving the combing device in a first arcuate direction to bend the leads; and
means for moving the device in a second arcuate direction opposite the first arcuate direction to remove the bend from the leads, the bending resulting in the straightening of the leads.

19. An apparatus for sorting electronic components with resilient leads extending from body portions thereof, which comprises:
a first wheel having spaced notches corresponding to the body portions of the components, the notches being located on the periphery of the wheel;
means for rotatably stepping the first wheel;
means for guiding tangentially the components to the first wheel so that the body portion of each component engages and is supported by one of the notches and so that the movement of the engaged component is under the control of the first wheel;
means for engaging the leads of such supported component with a combing device while the first wheel is at rest and moving such device linearly in a first direction and then engaging said leads with another combing device and moving it linearly in a second direction opposite the first direction to straighten said leads of the component in such direction;

means for engaging the leads of each supported component with the combing devices and moving them arcuately in a third and a fourth direction at right angles to the first and second directions to straighten said leads in such directions;

a second wheel having notches similar to those of the first wheel;

means for rotatably stepping the second wheel;

means for guiding tangentially the components with the straightened leads to the second wheel so that the support and movement of each component is under the control the second wheel;

a testing facility having electrical contacts connectable to the straightened leads of each supported component for determining certain characteristics of each component;

means for engaging the electrical contacts with the straightened leads of each supported components to determine such characteristics; and means for ejecting each component in an axial direction relative to the second wheel and into a bin in accordance with such characteristics.

* * * * *